US012769897B2

(12) United States Patent
Nargund et al.

(10) Patent No.: US 12,769,897 B2
(45) Date of Patent: Oct. 20, 2026

(54) METHOD AND SYSTEM FOR PERFORMING SEAMLESS ANALYSIS OF GEOMETRIC COMPONENTS IN MULTI-DOMAIN COLLABORATIVE SIMULATION ENVIRONMENTS

(71) Applicant: SIEMENS INDUSTRY SOFTWARE NV, Zaventem (BE)

(72) Inventors: Amit Nargund, Pune (IN); Aniruddha Katkar, Pune (IN); Kshitiz Johri, Pune (IN); Himanshu Khalate, Pune (IN)

(73) Assignee: SIEMENS INDUSTRY SOFTWARE NV, Zaventem (BE)

( * ) Notice: Subject to any disclaimer, the term of this patent is extended or adjusted under 35 U.S.C. 154(b) by 988 days.

(21) Appl. No.: 18/075,895

(22) Filed: Dec. 6, 2022

(65) Prior Publication Data

US 2023/0185977 A1 Jun. 15, 2023

(30) Foreign Application Priority Data

Dec. 10, 2021 (IN) ............................ 202131057594

(51) Int. Cl.
*G06F 30/12* (2020.01)
*G06F 30/20* (2020.01)

(52) U.S. Cl.
CPC .............. *G06F 30/12* (2020.01); *G06F 30/20* (2020.01)

(58) Field of Classification Search
None
See application file for complete search history.

(56) References Cited

U.S. PATENT DOCUMENTS

| | | | | |
|---|---|---|---|---|
| 9,213,788 | B2 * | 12/2015 | Huynh | G06F 17/13 |
| 11,281,824 | B2 * | 3/2022 | Van der Velden | G06F 30/20 |
| 11,797,730 | B1 * | 10/2023 | Yuan | G06F 30/15 |
| 2008/0276184 | A1 | 11/2008 | Buffet et al. | |
| 2014/0089817 | A1 | 3/2014 | Akkarbote et al. | |

(Continued)

FOREIGN PATENT DOCUMENTS

| | | | |
|---|---|---|---|
| CN | 101089883 | A | 12/2007 |
| CN | 104937594 | A | 9/2015 |

(Continued)

*Primary Examiner* — Paul S Schwarzenberg
(74) *Attorney, Agent, or Firm* — Schmeiser Olsen PLLC

(57) ABSTRACT

A method and system for performing seamless analysis of geometric components in multi-domain collaborative simulation environments. A method includes generating a simulation interface object corresponding to a geometric component in a first simulation environment. The simulation interface object includes load and boundary conditions associated with the geometric component. The method includes dynamically accessing the load and boundary conditions associated with the geometric component in a second simulation environment via the simulation interface object. The first simulation environment and the second simulation environment correspond to different domains. The method includes performing analysis of the geometric component in the second simulation environment based on the load and boundary conditions. Moreover, the method includes generating results of the analysis of the geometric component on a graphical user interface associated with the second simulation environment.

20 Claims, 5 Drawing Sheets

100

(56) References Cited

U.S. PATENT DOCUMENTS

| | | | | |
|---|---|---|---|---|
| 2019/0179981 | A1 | 6/2019 | Negishi et al. | |
| 2019/0303514 | A1 | 10/2019 | Winn | |
| 2021/0133294 | A1 * | 5/2021 | Harris | G06F 30/17 |

FOREIGN PATENT DOCUMENTS

| | | | | | |
|---|---|---|---|---|---|
| CN | 109918796 | A | | 6/2019 | |
| CN | 110059328 | A | | 7/2019 | |
| CN | 115061772 | A | * | 9/2022 | G06F 9/45504 |
| CN | 113935167 | B | * | 6/2025 | G06F 30/20 |
| EP | 4350511 | A1 | * | 4/2024 | G06F 30/20 |
| WO | WO-2026017216 | A1 | * | 1/2026 | G06F 30/17 |

* cited by examiner

METHOD AND SYSTEM FOR PERFORMING SEAMLESS ANALYSIS OF GEOMETRIC COMPONENTS IN MULTI-DOMAIN COLLABORATIVE SIMULATION ENVIRONMENTS

CROSS-REFERENCE TO RELATED APPLICATIONS

This application claims priority to IN Application No. 202131057594, having a filing date of Dec. 10, 2021, the entire contents of which are hereby incorporated by reference.

FIELD OF TECHNOLOGY

The following relates to a field of computer-aided engineering, and more particularly relates to a method and system for performing seamless analysis of geometric components in multi-domain collaborative simulation environments.

BACKGROUND

Typically, Computer-aided Engineering (CAE) analysts perform analysis of a computer-aided design (CAD) assembly using CAE tool. During the analysis, the CAD analyst may perform analysis in different analysis domains like Structural Analysis, Thermal Analysis for the same CAD assembly. A structural CAE analyst may need to share pre-defined load values and boundary condition data with a thermal CAE analyst such that the thermal CAE analyst can perform a combined structural-thermal analysis of the CAD assembly.

Also, CAE analysts may be simultaneous working on various levels of the CAD assembly. For example, a CAE analyst may be working on a blade assembly of an aero engine and another CAE analyst may be working on an assembly of entire aero engine consisting of the assembly of several blade assemblies. The CAE analyst working on the aero-engine assembly may need to reuse load values and boundary conditions from the simulation authored by the CAE analyst working on the blade assembly in the CAD assembly for the aero-engine. If the CAE analyst working on the blade assembly makes changes to load values and boundary conditions, the CAE analyst working on the aero-engine may not be aware of the changes made to the load values and boundary conditions. This may cause the CAE analyst working on the aero-engine assembly to use outdated load values and boundary conditions, leading to erroneous analysis of the aero-engine assembly consisting of the blade assembly.

SUMMARY

The present disclosure relates to a method and system for performing seamless analysis of geometric component in multi-domain collaborative simulation environments. In one aspect, a method for performing seamless analysis of a geometric component in multi-domain collaborative simulation environments includes generating a simulation interface object corresponding to the geometric component in a first simulation environment. The simulation interface object includes load and boundary conditions associated with the geometric component. The simulation interface object communicatively connects the first simulation environment with a second simulation environment in real-time. The method also includes dynamically accessing the load and boundary conditions associated with the geometric component in the second simulation environment via the simulation interface object. The first simulation environment and the second simulation environment correspond to different domains. The method includes performing analysis of the geometric component in the second simulation environment based on the load and boundary conditions. Moreover, the method includes generating results of the analysis of the geometric component on a graphical user interface associated with the second simulation environment.

Furthermore, the method may include generating associative copies of the load and boundary conditions associated with the geometric component being analyzed in the first simulation environment in the second simulation environment using the simulation interface object. Also, the method may include determining whether at least one property value of the load and boundary conditions associated with the geometric component is modified in the first simulation environment using the simulation interface object. If at least one property value of the load and boundary conditions is modified, the method may include dynamically updating the second simulation environment based on the at least one modified property value of the load and boundary conditions in the first simulation environment in real-time. The method may include performing analysis of the geometric component in the updated second simulation environment. Additionally, the method may include generating results of the analysis of the geometric component in the updated second simulation environment on a graphical user interface.

In dynamically updating the second simulation environment based on the at least one modified property value of the load and boundary conditions in real-time, the method may include dynamically updating the associative copy of the load and boundary conditions associated with the geometric component in the second simulation environment using the at least one modified property value in the simulation interface object.

In generating the simulation interface object corresponding to the geometric component in the first simulation environment, the method may include generating the load and boundary conditions associated with the geometric component in the first simulation environment and generating the simulation interface object corresponding to the geometric component in the first simulation environment based on the generated load and boundary conditions.

In another aspect, the product data management system includes a processing unit, and a memory unit communicatively coupled to the processing unit. The memory unit includes a simulation interface module configured to generate a simulation interface object including load and boundary conditions associated with the geometric component in a first simulation environment, and dynamically access the load and boundary conditions associated with the geometric component in a second simulation environment via the simulation interface object. The first simulation environment and the second simulation environment correspond to different domains. The simulation interface object is configured to communicatively connect the first simulation environment and the second simulation environment in real-time. The memory unit includes a solver module configured to perform analysis of the geometric component in the second simulation environment based on the load and boundary conditions and generate results of the analysis of the geometric component on a graphical user interface associated with the second simulation environment.

The simulation interface module is configured to generate associative copies of the load and boundary conditions associated with the geometric component being analyzed in the first simulation environment in the second simulation environment using the simulation interface object.

The simulation interface module is configured to determine whether at least one property value of the load and boundary conditions associated with the geometric component is modified in the first simulation environment via the simulation interface object. If the at least one property value of the load and boundary conditions is modified, the simulation interface module is configured for dynamically update the second simulation environment based on the at least one modified property value of the load and boundary conditions in real-time. The simulation interface module is configured for perform analysis of the geometric component in the updated second simulation environment. Furthermore, the simulation interface module is configured to generate results of the analysis of the geometric component in the updated second simulation environment on a graphical user interface.

In dynamically updating the second simulation environment based on the at least one modified property value, the simulation interface module is configured to dynamically update the associative copy of the load and boundary conditions associated with the geometric component in the second simulation environment using the at least one modified property value in the simulation interface object.

In generating the simulation interface object corresponding to the geometric component in the first simulation environment, the simulation interface module is configured to generate the load and boundary conditions associated with the geometric component in the first simulation environment and generate the simulation interface object corresponding to the geometric component in the first simulation environment using the generated load and boundary conditions.

In yet another aspect, a non-transitory computer-readable storage medium having machine-readable instructions stored therein, that when executed by a product data management system, cause the product data management system to perform method of performing analysis of a geometric component in multi-domain collaboration simulation environments as described above.

BRIEF DESCRIPTION

Some of the embodiments will be described in detail, with reference to the following figures, wherein like designations denote like members, wherein.

Figure 4:
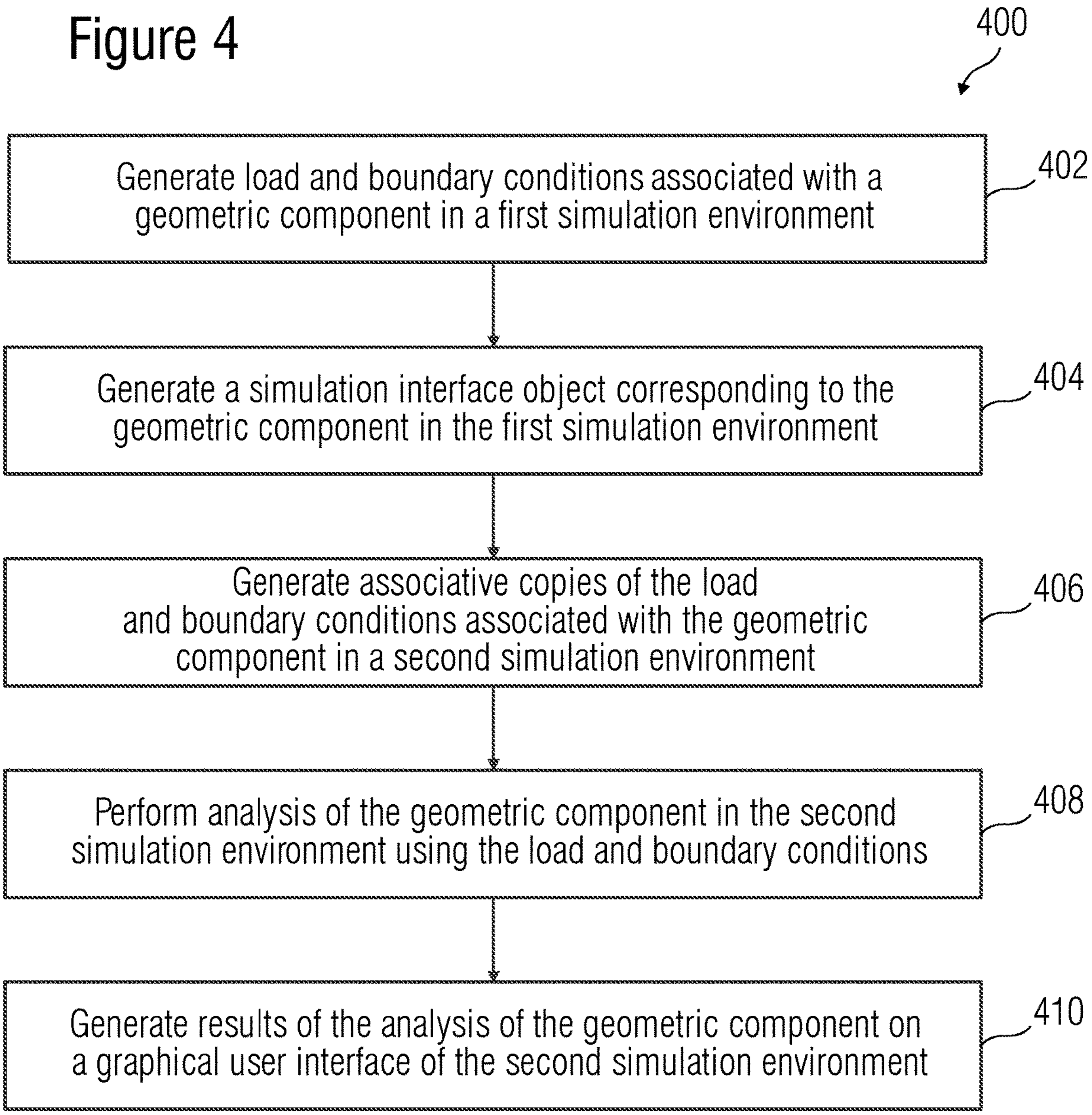
Figure 5:
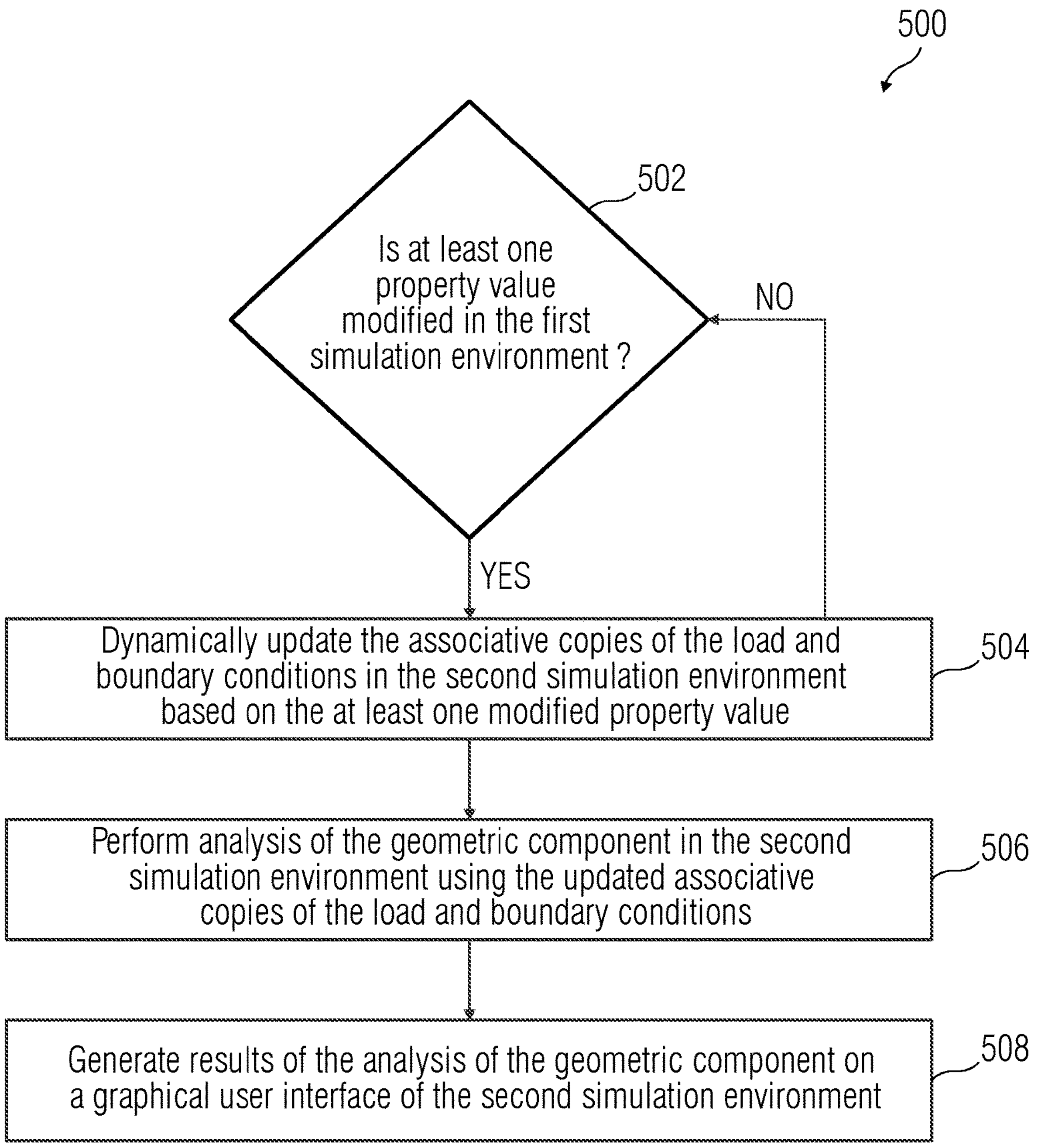

FIG. 4 is a process flowchart depicting an exemplary method of performing seamless analysis of geometric components in multi-domain collaborative simulation environments, according to one embodiment; and FIG. 5 is a process flowchart depicting an exemplary method of dynamically updating associative copies of load and boundary conditions in a second simulation environment based on modifications made to the load and boundary conditions in a first simulation environment in real-time, according one embodiment.

DETAILED DESCRIPTION

The present disclosure relates to a method and system for performing seamless analysis of geometric components in multi-domain collaborative simulation environments. Various embodiments are described with reference to the drawings, where like reference numerals are used in reference to the drawings. Like reference numerals are used to refer to like elements throughout. In the following description, numerous specific details are set forth in order to provide a thorough understanding of embodiments. These specific details need not be employed to practice embodiments. In other instances, well known materials or methods have not been described in detail in order to avoid unnecessarily obscuring embodiments. While the disclosure is susceptible to various modifications and alternative forms, specific embodiments thereof are shown by way of example in the drawings and will herein be described in detail. There is no intent to limit the disclosure to the particular forms disclosed. Instead, the disclosure is to cover all modifications, equivalents, and alternatives falling within the spirit and scope of the present disclosure.

Figure 1:
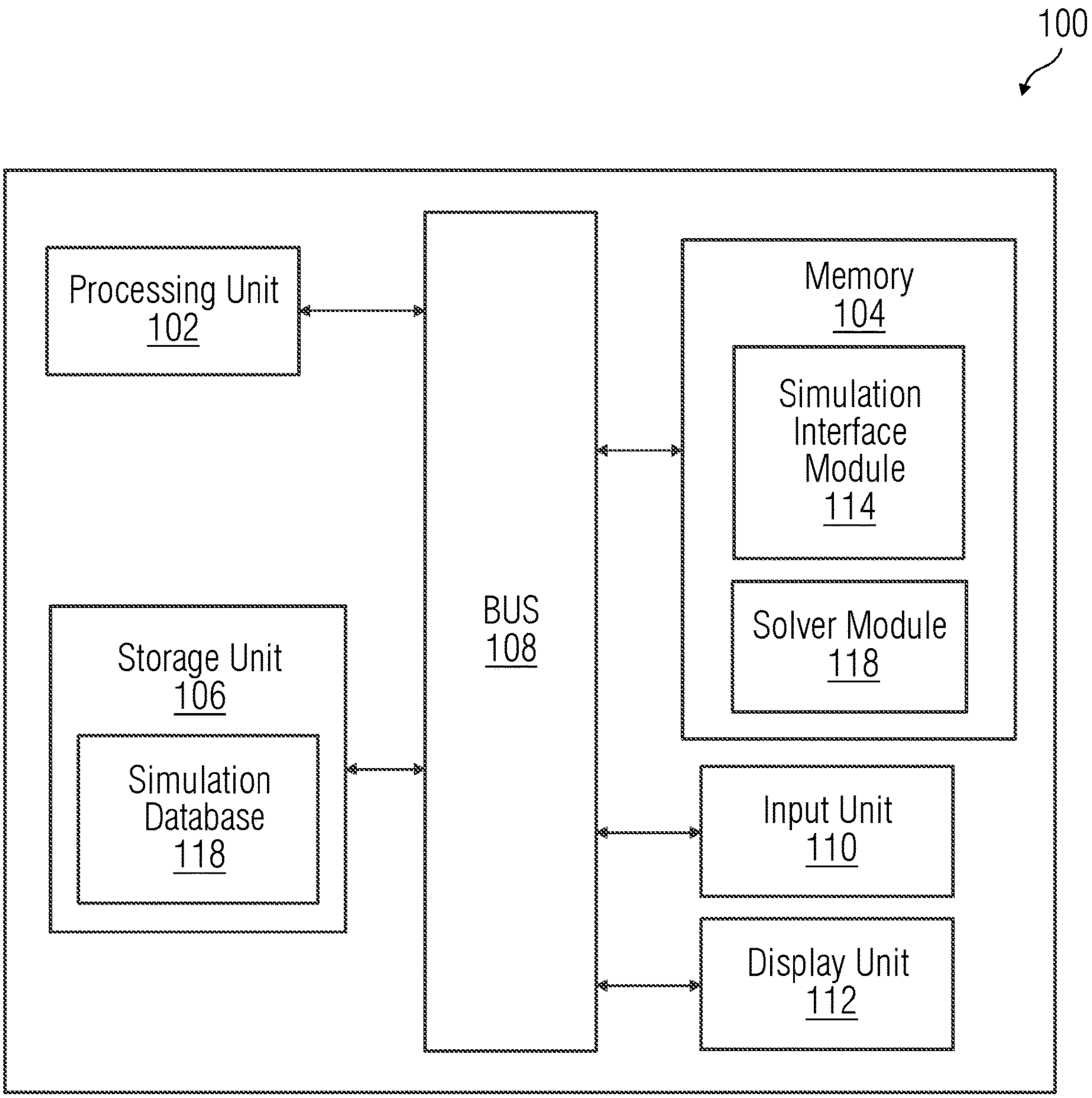
FIG. 1 is a block diagram of an exemplary product data management system capable of performing seamless analysis of geometric components in multi-domain collaborative simulation environments, according to one embodiment.

FIG. 1 is a block diagram of an exemplary product data management system 100 capable of performing seamless analysis on geometric components in multi-domain collaborative simulation environments, according to one embodiment. The product data management system 100 may be a personal computer, workstation, laptop computer, tablet computer, and the like. In FIG. 1, the product data management system 100 includes a processing unit 102, a memory unit 104, a storage unit 106, a bus 108, an input unit 110, and a display unit 112.

The processing unit 102, as used herein, means any type of computational circuit, such as, but not limited to, a microprocessor, microcontroller, complex instruction set computing microprocessor, reduced instruction set computing microprocessor, very long instruction word microprocessor, explicitly parallel instruction computing microprocessor, graphics processor, digital signal processor, or any other type of processing circuit. The processing unit 102 may also include embedded controllers, such as generic or programmable logic devices or arrays, application specific integrated circuits, single-chip computers, and the like.

The memory unit 104 may be non-transitory volatile memory and non-volatile memory. The memory unit 104 may be coupled for communication with the processing unit 102, such as being a computer-readable storage medium. The processing unit 102 may execute instructions and/or code stored in the memory unit 104. A variety of computer-readable instructions may be stored in and accessed from the memory unit 104. The memory unit 104 may include any suitable elements for storing data and machine-readable instructions, such as read only memory, random access memory, erasable programmable read only memory, electrically erasable programmable read only memory, a hard drive, a removable media drive for handling compact disks, digital video disks, diskettes, magnetic tape cartridges, memory cards, and the like.

In the present embodiment, the memory unit 104 includes a simulation interface module 114 and a solver module 118 stored in the form of machine-readable instructions on any of the above-mentioned storage media and may be in communication to and executed by the processing unit 102. The simulation interface module 114 cause the processing unit 102 to generate a simulation interface object corresponding to a geometric component in a first simulation environment. The simulation interface object includes load and/or boundary conditions associated with the geometric component. For example, the simulation interface object is a container that can hold one or more loads and/or boundary conditions. Loads are forces that can act on a mechanical system. In structural domain, load can be force, pressure, moments, torques etc. In thermal domain, the load can be heat loads. Loads can be applied on nodes, elements, element Faces, element edges. Boundary conditions are conditions that exist on nodes. For example, a set of nodes may have multiple degrees of freedom such as translation and rotation, or a set of nodes can have an enforced displacement. In thermal domain, boundary condition can be temperature at a few nodes.

The simulation interface module 114 cause the processing unit 102 to dynamically access the load and boundary conditions associated with the geometric component in a second simulation environment via the simulation interface object. The second simulation environment corresponds to a different analysis domain from the first simulation environment. The simulation interface module 114 cause the processing unit 102 to perform analysis of the geometric component in the second simulation environment based on the load and boundary conditions.

The solver module 118 cause the processing unit 102 to generate results of the analysis of the geometric component on a graphical user interface associated with the second simulation environment. The simulation interface module 114 cause the processing unit 102 to dynamically update the load and boundary conditions associated with the geometric component in the second simulation environment in real-time if property values of the load and boundary conditions are modified in the first simulation environment. The solver module 118 cause the processing unit 102 to perform analysis of the geometric component in the second simulation environment based on the updated load and boundary conditions and generate results of the analysis of the geometric component on a graphical user interface associated with the display unit 112.

In an exemplary implementation, a first user (e.g., blade analyst) of the first simulation environment creates load F with properties (expression P1, region R1 and selection recipes SR1) for a blade assembly in the first simulation environment. The user wishes to perform structural analysis on the blade assembly using the load and boundary conditions. The simulation interface module 114 creates a simulation interface object for the load F. Consider that another user (e.g., thermal analyst) is simultaneously preparing a second simulation environment on another device for performing structural and thermal analysis of an aero-engine assembly. The aero-engine assembly consists of the blade assembly being simulated in the first simulation environment. The user wishes to reuse the load and boundary conditions associated with the blade assembly in the first simulation environment. Accordingly, the simulation interface module 114 automatically creates associative copies of the load F and properties (expression P1, region R1 and selection recipes SR1) of the blade assembly in a simulation interface tracker of the second simulation environment.

Now consider that the user working in the first simulation environment modifies property associated with the load F (e.g., change in expression from P1 to P2) for the blade assembly. In such a case, the simulation interface module 114 notifies a second user (e.g., aero engine analyst) working in the second simulation environment that the expression associated with the load F is changed from P1 to P2. Additionally, the simulation interface module 114 dynamically updates associative copies of the load and boundary conditions of the blade assembly in the simulation interface tracker of the second simulation environment in real-time. Advantageously, structural and thermal analysis of the aero-engine assembly consisting of the blade assembly in the second simulation environment can be seamlessly performed as the modified boundary conditions of the blade assembly are updated in the second simulation environment in real-time. In this manner, the load and boundary conditions of the blade assembly in the first simulation environment can be instantaneously reused by the user of the second simulation environment for performing analysis of the aero-engine assembly.

The storage unit 106 may be a non-transitory storage medium which stores a simulation database 116. The simulation database 116 stores the simulation data, simulation interface objects and information associated with the geometric components. The input unit 110 may include input devices such as keypad, touch-sensitive display, camera (such as a camera receiving gesture-based inputs), etc. capable of receiving input for performing seamless analysis of geometric components in multi-domain collaborative simulation environments. The display unit 112 may be a device with a graphical user interface displaying simulation environments and results of analysis of the geometric component in the simulation environments. The bus 108 acts as interconnect between the processing unit 102, the memory unit 104, the storage unit 106, the input unit 110, and the display unit 112.

Those of ordinary skilled in the art will appreciate that the hardware components depicted in FIG. 1 may vary for particular implementations. For example, other peripheral devices such as an optical disk drive and the like, Local Area Network (LAN)/Wide Area Network (WAN)/Wireless (e.g., Wi-Fi) adapter, graphics adapter, disk controller, input/output (I/O) adapter also may be used in addition to or in place of the hardware depicted. The depicted example is provided for the purpose of explanation only and is not meant to imply architectural limitations with respect to the present disclosure.

The product data management system 100 in accordance with an embodiment of the present disclosure includes an operating system employing a graphical user interface. The operating system permits multiple display windows to be presented in the graphical user interface simultaneously with each display window providing an interface to a different application or to a different instance of the same application. A cursor in the graphical user interface may be manipulated by a user through the pointing device. The position of the cursor may be changed and/or an event such as clicking a mouse button, generated to actuate a candidate response.

Although, the above description is explained with reference to reuse of loads and boundary conditions by a target simulation environment from a single source simulation environment, the simulation interface module 114 can enable a simulation environment to access load values from a first source simulation environment, condition sequences (i.e., a kind of boundary condition) from a second source simulation environment, fields and expression definitions from a third source simulation environment, selection recipes from a fourth source simulation environment, and so on. A user of each of the source simulation environments can be different and continuously updates the simulation interface objects in the respective simulation source environments. These modification notifications may be received by the target simulation environment(s), thereby enabling seamless collaborative analysis and simulation of geometric components. Advantageously, the user owning the simulation environment can build entire simulations by reusing the simulation interface objects from various simulation files in real-time, thereby allowing for reuse and timely updates.

Figure 2:
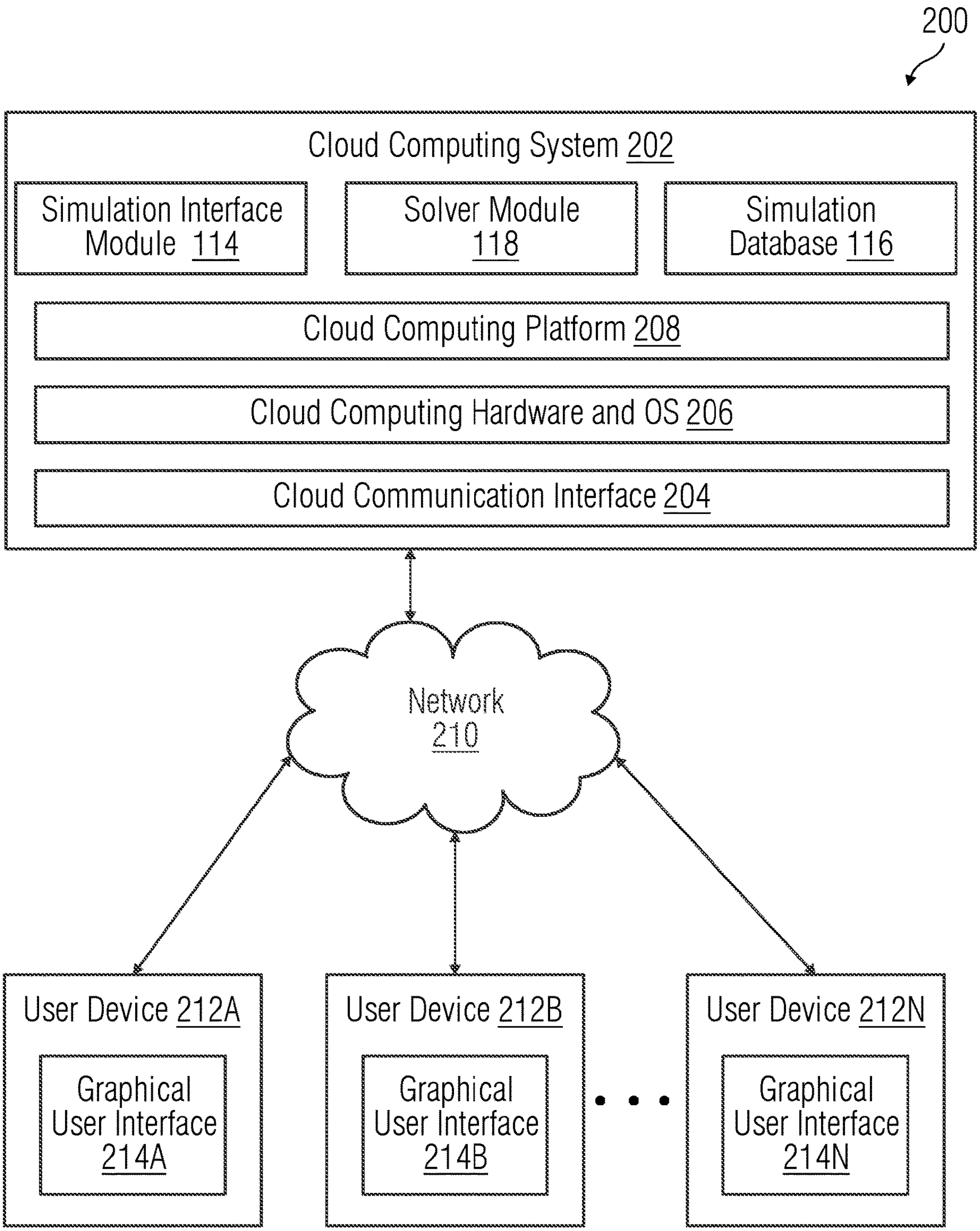
FIG. 2 is a schematic representation of a product data management system capable of performing seamless analysis of geometric components in multi-domain collaborative simulation environments, according to another embodiment.

FIG. 2 is a schematic representation of a product data management system 200 capable of performing seamless analysis of geometric components in multi-domain collaborative simulation environments, according to another embodiment. Particularly, the system 200 includes a cloud computing system 202 configured for providing cloud services for multi-domain collaborative simulation of geometric components/assemblies.

The cloud computing system 202 includes a cloud communication interface 204, cloud computing hardware and OS 206, a cloud computing platform 208, the simulation interface module 114, and the simulation database 116. The cloud communication interface 204 enables communication between the cloud computing platform 208, and user devices 212A-N such as smart phone, tablet, computer, etc. via a network 210.

The cloud computing hardware and OS 206 may include one or more servers on which an operating system (OS) is installed and includes one or more processing units, one or more storage devices for storing data, and other peripherals required for providing cloud computing functionality. The cloud computing platform 208 is a platform which implements functionalities such as data storage, data analysis, data visualization, data communication on the cloud hardware and OS 206 via APIs and algorithm; and delivers the aforementioned cloud services using cloud-based applications (e.g., application for analyzing geometric components). The cloud computing platform 208 employs the simulation interface module 114 for providing seamless access to load and boundary conditions of geometric components across simulation environments, and the solver module 118 for enabling analysis and simulation of geometric components in muti-domain collaborative simulation environments as described in FIG. 1. The cloud computing platform 208 also includes the simulation database 116 for storing component information, simulation interface objects and simulation results.

The user devices 212A-N include graphical user interfaces 214A-N for performing analysis of geometric components in multi-domain collaborative simulation environments. Each of the user devices 212A-N may be provided with a communication interface for interfacing with the cloud computing system 202. Users (e.g., CAE analyst) of the user devices 212A-N can access the cloud computing system 202 via the graphical user interfaces 214A-N. The graphical user interfaces 214A-N may be specifically designed for accessing the simulation interface module 114 in the cloud computing system 202.

Figure 3:
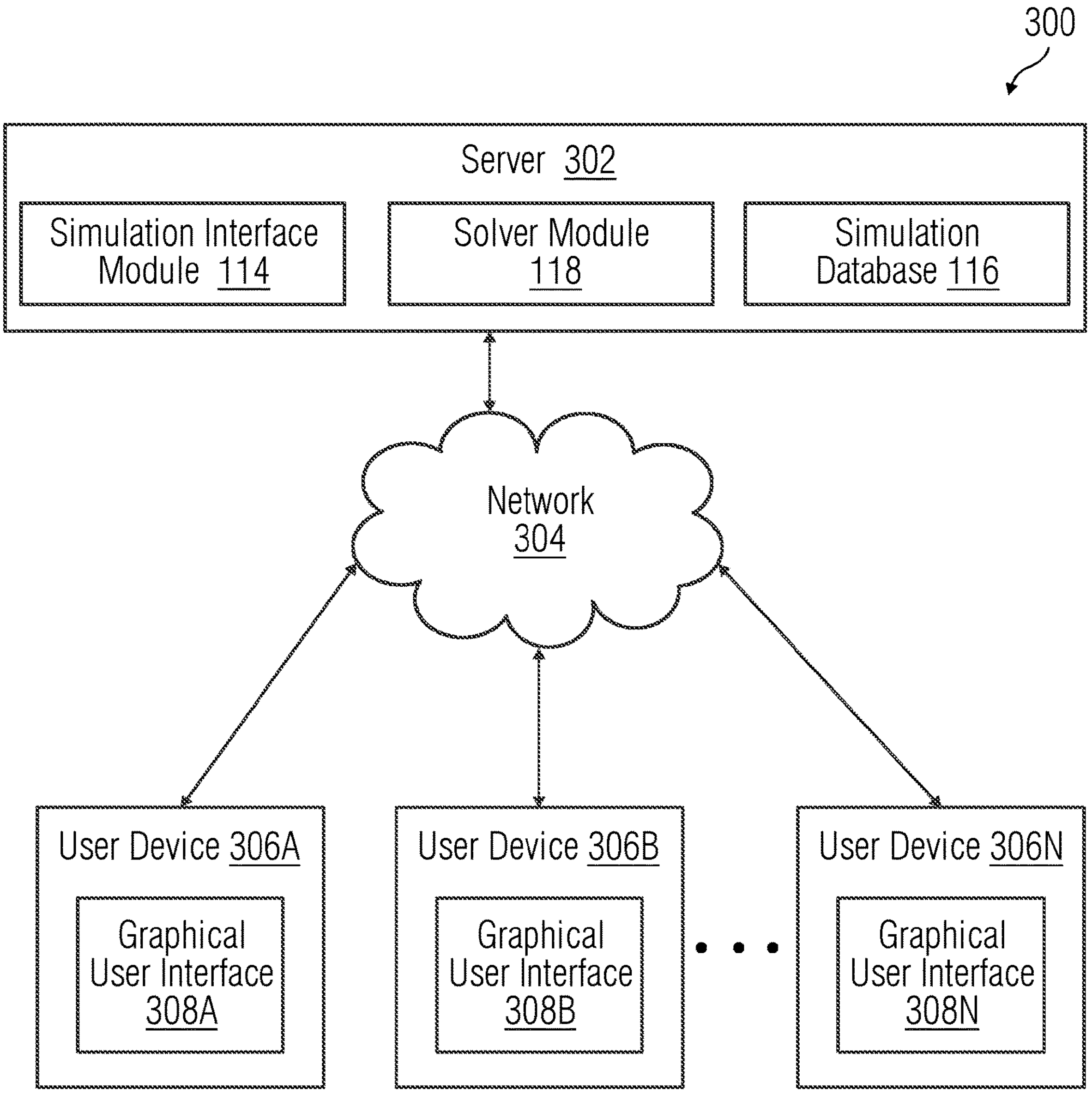
FIG. 3 illustrates a block diagram of a product data management system for performing seamless analysis of geometric components in multi-domain collaborative simulation environments, according to yet another embodiment.

FIG. 3 illustrates a block diagram of a product data management system 300 capable of performing seamless analysis of geometric components in multi-domain collaborative simulation environments, according to yet another embodiment. Particularly, the product management system 300 includes a server 302 and a plurality of user devices 306A-N. Each of the user devices 306A-N is connected to the server 302 via a network 304 (e.g., Local Area Network (LAN), Wide Area Network (WAN), Wi-Fi, etc.). The system 300 is another implementation of the product data management system 100 of FIG. 1, where the simulation interface module 114 and the solver module 118 resides in the server 302 and is accessed by user devices 306A-N via the network 304.

The server 302 includes the simulation interface module 114, the solver module 118, and the simulation database 116. The server 302 may also include a processing unit, a memory unit, and a storage unit. The simulation interface module 114 and the solver module 118 may be stored on the memory unit in the form of machine-readable instructions and executable by the processing unit. The simulation database 116 may be stored in the storage unit. The server 302 may also include a communication interface for enabling communication with user devices 306A-N via the network 304.

FIG. 4 is a process flowchart 400 depicting an exemplary method of performing seamless analysis of geometric components in a multi-domain collaboration simulation environment, according to one embodiment. At step 402, load and boundary conditions associated with a geometric component in a first simulation environment is generated. Consider that the geometric component in the first simulation environment is a blade assembly of an aero engine. The load and boundary conditions may include 1) Target sets and 2) Property table. The target sets include finite element entities such as Nodes, Elements, Faces, Edges or its collections where the loads and boundary conditions are applied. The property table includes properties like expressions, fields, regions, material, modeling object, physical properties and so on. The expressions may be formula that define relationship between a dependent variable (e.g., pressure) and independent variable (e.g., coordinates). The fields include datapoints with respect to the dependent entities and the independent entities. The regions include solver specific properties defined with a selection of nodes/elements/faces/edges. The materials may include material properties like yield stress, density. The modeling objects includes solver specific parameters. The physical may include physical properties like thickness of elements. The load and boundary conditions are referred to as independent entities whereas the properties are referred as dependent entities.

At step 404, a simulation interface object corresponding to the geometric component in the first simulation environment is generated. The load and boundary conditions are updated in the simulation interface object corresponding to the geometric component.

At step 406, associative copies of the load and boundary conditions associated with the geometric component are generated in a second simulation environment using the simulation interface object. In some embodiments, the second simulation environment includes the geometric component which is being prepared for analysis substantially simultaneously with the first simulation environment. The first simulation environment and the second simulation environment correspond to different analysis domains (e.g., structural, thermal, etc.). For example, the first simulation environment is prepared for performing structural analysis on the geometric component (e.g., a blade assembly) whereas the second simulation environment is prepared for performing thermal analysis on the geometric component. In some embodiments, the geometric component may be a standalone component (e.g., a turbine blade) which is analyzed in the first simulation environment and the second simulation environment. In other embodiments, the geometric component in the first simulation environment may be a part of larger geometric assembly (e.g., aero turbine assembly) in the second simulation environment.

A simulation interface tracker is generated in the second simulation environment. In some embodiments, the simulation interface tracker is generated when the simulation interface object is consumed by the user in the first simulation environment for the first time. The load and boundary conditions and associated properties (also referred to as independent and dependent entities) are mirrored in the simulation interface tracker by traversing through the simulation interface object in the first simulation environment. In an exemplary embodiment, for every independent and dependent entity, the associative copies of the load and boundary conditions of the geometric component are created by creating an entity pair between an entity in the first simulation environment and a mirror entity in the second simulation environment. The entity pair stores property values of the load and boundary conditions. The entity pair of independent entities are stored in entity pair buckets unique to occurrence they are based on. The entity pair buckets are stored in a simulation interface tracker in the second simulation environment. The simulation interface tracker contains details of single consumed simulation interface object and associativity of the entity pair between the first simulation environment and the second simulation environment (i.e., details of entity pair buckets). The entity pairs associated with the dependent entities, which are common between all part occurrences, are stored along with the entity pair buckets in the simulation interface tracker. The entity pairs specific to individual part occurrences are stored along with the individual entities in the entity pair buckets. When there is a change made to the property values of the load and boundary conditions in the first simulation environment, the mirror entity in the second simulation environment is updated with new property values, thereby maintaining associativity between the first simulation environment and the second simulation environment.

At step 408, analysis of the geometric component is performed in the second simulation environment using the load and boundary conditions. At step 410, results of the analysis of the geometric component are generated on a graphical user interface associated with the second simulation environment.

FIG. 5 is a process flowchart 500 depicting an exemplary method of dynamically updating property values of the load and boundary conditions in a second simulation environment based on modifications made to the property values of the load and boundary conditions in a first simulation environment in real-time, according one embodiment. At step 502, it is determined whether at least one property value of the load and boundary conditions associated with the geometric component is modified in the first simulation environment using the simulation interface object. If the at least one property value of the load and boundary conditions is modified, at step 504, the second simulation environment is dynamically updated based on the at least one modified property value of the load and boundary conditions in the first simulation environment in real-time. In some embodiments, the associative copies of the load and boundary conditions in the second simulation environment are dynamically updated based on the at least one modified property value in the simulation interface object. For example, if property values associated with the entity in the first simulation environment is modified, the simulation interface tracker is notified of the modified property values in real-time by the simulation interface object. The entity pair in the simulation interface tracker is updated with the modified property values. In some embodiments, update to the entity pairs in the simulation interface tracker takes place as follows. If any of the entities in the simulation interface object are deleted, then mirror entities in the simulation interface tracker along with respective entity pairs are deleted. The dependent entities common to all part occurrences are synchronized in the simulation interface tracker. The dependent entities and the independent entities in the entity pair buckets for individual part occurrences are synchronized in loop in ordered manner i.e., dependent entities followed by independent entities. If any of the existing independent entities are referring to new dependent entities, then the independent entities are updated. The new dependent entities are identified by traversing through the independent entities. Finally, any new independent entities are added in the simulation interface tracker using the entity pair buckets. In one embodiment, the entity pair in the simulation interface tracker operates at an individual reference entity level, hence modified entities are updated and instead of the entire load and boundary conditions. If the at least one property value associated with the geometric component is unchanged, then the process goes back to step 502.

At step 506, analysis of the geometric component is performed in the second simulation environment using the updated associated copies of the load and boundary conditions of the geometric component. At step 508, output of the analysis of the updated geometric component in the updated second simulation environment is generated on a graphical user interface.

It is to be understood that the system and methods described herein may be implemented in various forms of hardware, software, firmware, special purpose processing units, or a combination thereof. One or more of the present embodiments may take a form of a computer program product (non-transitory computer readable storage medium having instructions, which when executed by a processor, perform actions) including program modules accessible from computer-usable or computer-readable medium storing program code for use by or in connection with one or more computers, processing units, or instruction execution system.

For the purpose of this description, a computer-usable or computer-readable medium may be any apparatus that may contain, store, communicate, propagate, or transport the program for use by or in connection with the instruction execution system, apparatus, or device. The medium may be an electronic, magnetic, optical, electromagnetic, infrared, or semiconductor system (or apparatus or device) or a propagation mediums in and of themselves as signal carriers are not included in the definition of physical computer-readable medium including a semiconductor or solid state memory, magnetic tape, a removable computer diskette, random access memory (RAM), a read only memory (ROM), a rigid magnetic disk, optical disk such as compact disk read-only memory (CD-ROM), compact disk read/write, and digital versatile disc (DVD) or any combination thereof. Both processing units and program code for implementing each aspect of the technology may be centralized or distributed (or a combination thereof) as known to those skilled in the art.

Although the present invention has been disclosed in the form of embodiments and variations thereon, it will be understood that numerous additional modifications and variations could be made thereto without departing from the scope of the invention.

For the sake of clarity, it is to be understood that the use of “a” or “an” throughout this application does not exclude a plurality, and “comprising” does not exclude other steps or elements.

What is claimed is:

1. A method for performing seamless analysis of geometric components in a multi-domain collaborative simulation environment, said method comprising:

generating a simulation interface object corresponding to a geometric component being simulated in a first simulation environment, wherein the simulation interface object comprises load and boundary conditions associated with the geometric component;

dynamically accessing the load and boundary conditions associated with the geometric component in a second simulation environment via the simulation interface object, wherein the first simulation environment and the second simulation environment are in different computing devices;

performing an analysis of the geometric component in the second simulation environment based on the load and boundary conditions; and generating results of the analysis of the geometric component on a graphical user interface associated with the second simulation environment.

2. The method of claim 1, wherein the simulation interface object communicatively connects the first simulation environment and the second simulation environment in real-time.

3. The method of claim 1, said method further comprising:

generating, in the second simulation environment using the simulation interface object, associative copies of the load and boundary conditions associated with the geometric component being simulated in the first simulation environment.

4. The method of claim 1, wherein generating the simulation interface object corresponding to the geometric component in the first simulation environment comprises:

generating the load and boundary conditions associated with the geometric component in the first simulation environment; and generating the simulation interface object corresponding to the geometric component in the first simulation environment using the generated load and boundary conditions.

5. A non-transitory computer-readable storage medium having machine-readable instructions stored therein, that when executed by a product data management system, cause the product data management system to perform the method of claim 1.

6. The storage medium of claim 5, wherein the product data management system is configured to perform method steps comprising:

generating associative copies of the load and boundary conditions associated with the geometric component being simulated in the first simulation environment in the second simulation environment using the simulation interface object.

7. The storage medium of claim 6, wherein the product data management system is configured to perform method steps comprising:

in response to a determination that the at least one property value of the load and boundary conditions associated with the geometric component is modified in the first simulation environment, dynamically updating the second simulation environment based on the at least one modified property value of the load and boundary conditions in real-time.

8. The storage medium of claim 7, wherein product data management system is configured to perform method steps comprising:

performing analysis of the geometric component in the updated second simulation environment; and generating results of the analysis of the updated geometric component in the updated second simulation environment on a graphical user interface.

9. The storage medium of claim 7, wherein, in dynamically updating the second simulation environment, the product data management system is configured to perform method steps comprising:

dynamically updating the associative copy of the at least one modified property value of the load and boundary conditions in the second simulation environment using the at least one modified property value in the simulation interface object.

10. The storage medium of claim 5, wherein, in generating the simulation interface object corresponding to the geometric component in the first simulation environment, the product data management system is configured to perform method steps comprising:

generating the load and boundary conditions associated with the geometric component in the first simulation environment; and generating the simulation interface object corresponding to the geometric component in the first simulation environment using the generated load and boundary conditions.

11. A method for performing seamless analysis of geometric components in a multi-domain collaborative simulation environment, comprising:

generating a simulation interface object corresponding to a geometric component in a first simulation environment, wherein the simulation interface object comprises load and boundary conditions associated with the geometric component;

dynamically accessing the load and boundary conditions associated with the geometric component in a second simulation environment via the simulation interface object, wherein the first simulation environment and the second simulation environment correspond to different domains computing devices;

generating results of an analysis of the geometric component on a graphical user interface associated with the second simulation environment, said analysis based on the load and boundary conditions;

generating, in the second simulation environment using the simulation interface object, associative copies of the load and boundary conditions associated with the geometric component being analyzed in the first simulation environment; and in response to a determination that at least one property value of the load and boundary conditions associated with the geometric component is modified in the first simulation environment, dynamically updating the second simulation environment based on the at least one modified property value of the load and boundary conditions in real-time.

12. The method of claim 11, further comprising:

performing analysis of the geometric component in the updated second simulation environment; and generating results of the analysis of the dynamically updated geometric component in the updated second simulation environment on a graphical user interface.

13. The method of claim 11, wherein dynamically updating the second simulation environment based on the at least one modified property value of the load and boundary conditions in real-time, comprises:

dynamically updating an associative copy of the load and boundary conditions associated with the geometric component in the second simulation environment based on the at least one modified property value in the simulation interface object.

14. A product data management system comprising:

a processing unit; and a memory unit communicatively coupled to the processing unit, wherein the memory unit comprises:

a simulation interface module configured to:

generate a simulation interface object corresponding to the geometric component being simulated in a first simulation environment, wherein the simulation interface object comprises load and boundary conditions associated with the geometric component;

dynamically access the load and boundary conditions associated with the geometric component in a second simulation environment via the simulation interface object, and wherein the first simulation environment and the second simulation environment are in different computing devices; and a solver module configured to:

perform an analysis of the geometric component in the second simulation environment based on the load and boundary conditions; and generate results of the analysis of the geometric component on a graphical user interface associated with the second simulation environment.

15. The product data management system of claim 14, wherein the simulation interface object is configured to communicatively connect the first simulation environment and the second simulation environment in real-time.

16. The product data management system of claim 14, wherein the simulation interface module is configured to generate associative copies of the load and boundary conditions associated with the geometric component being analyzed in the first simulation environment in the second simulation environment using the simulation interface object.

17. The product data management system of claim 16, wherein the simulation interface module is configured to:

in response to a determination that the at least one property value of the load and boundary conditions is modified in the first simulation environment, dynamically update the second simulation environment based on the at least one modified property value of the load and boundary conditions in real-time.

18. The product data management system of claim 17, wherein the solver module is configured to:

perform analysis of the geometric component in the updated second simulation environment; and generate results of the analysis of the geometric component in the updated second simulation environment on a graphical user interface.

19. The product data management system of claim 17, wherein in dynamically updating the second simulation environment based on the at least one modified property value of the load and boundary conditions, the simulation interface module is configured to:

dynamically update the associative copy of the load and boundary conditions associated with the geometric component in the second simulation environment using the at least one modified property value in the simulation interface object.

20. The product data management system of claim 14, wherein in generating the simulation interface object corresponding to the geometric component in the first simulation environment, the simulation interface module is configured to:

generate the load and boundary conditions associated with the geometric component in the first simulation environment; and generate the simulation interface object corresponding to the geometric component in the first simulation environment using the generated load and boundary conditions.

* * * * *